US012658399B2

(12) United States Patent
Aida et al.

(10) Patent No.: US 12,658,399 B2
(45) Date of Patent: Jun. 16, 2026

(54) ION MILLING APPARATUS

(71) Applicant: Hitachi High-Tech Corporation, Tokyo (JP)

(72) Inventors: Shota Aida, Tokyo (JP); Hisayuki Takasu, Tokyo (JP); Kento Horinouchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 440 days.

(21) Appl. No.: 18/560,707

(22) PCT Filed: May 27, 2021

(86) PCT No.: PCT/JP2021/020112
§ 371 (c)(1),
(2) Date: Nov. 14, 2023

(87) PCT Pub. No.: WO2022/249371
PCT Pub. Date: Dec. 1, 2022

(65) Prior Publication Data
US 2024/0258062 A1 Aug. 1, 2024

(51) Int. Cl.
*H01J 37/08* (2006.01)
*H01J 37/04* (2006.01)
*H01J 37/30* (2006.01)
*H01J 37/305* (2006.01)

(52) U.S. Cl.
CPC ............ *H01J 37/08* (2013.01); *H01J 37/045* (2013.01); *H01J 37/3053* (2013.01); *H01J 2237/04735* (2013.01); *H01J 2237/24585* (2013.01)

(58) Field of Classification Search
CPC ...... H01J 37/08; H01J 37/045; H01J 37/3053; H01J 2237/04735; H01J 2237/24585
See application file for complete search history.

(56) References Cited

U.S. PATENT DOCUMENTS 9,761,424 B1 * 9/2017 Gorokhovsky ..... C23C 14/0641
2018/0130630 A1 5/2018 Tani et al.

FOREIGN PATENT DOCUMENTS

DE 10 2016 105 462 A1 6/2017
JP 2014-235948 A 12/2014
WO WO 2016/189614 A1 * 3/2018

OTHER PUBLICATIONS

International Search Report (PCT/ISA/2010) issued in PCT Application No. PCT/JP2021/020112 dated Aug. 3, 2021 with English translation (4 pages).
Japanese-language Written Opinion (PCT/ISA/237) issued in PCT Application No. PCT/JP2021/020112 dated Aug. 3, 2021 with English translation (7 pages).

* cited by examiner

*Primary Examiner* — Nicole M Ippolito
(74) *Attorney, Agent, or Firm* — Crowell & Moring LLP

(57) ABSTRACT

In a state in which an ion beam from an ion source 101 is shielded by a shutter 102, an ion milling apparatus applies a discharge voltage Vd between an anode 203 and cathodes 201 and 202 and an acceleration voltage Va between the anode and an acceleration electrode 205 with respect to the ion source, and retracts the shutter by a shutter drive source 103 to a position where the ion beam is not shielded after any one of a discharge current flowing between the anode and the cathodes due to discharge and an ion beam current flowing caused by irradiation on the shutter the ion beam falls below a predetermined reference value.

9 Claims, 8 Drawing Sheets

[FIG. 1]
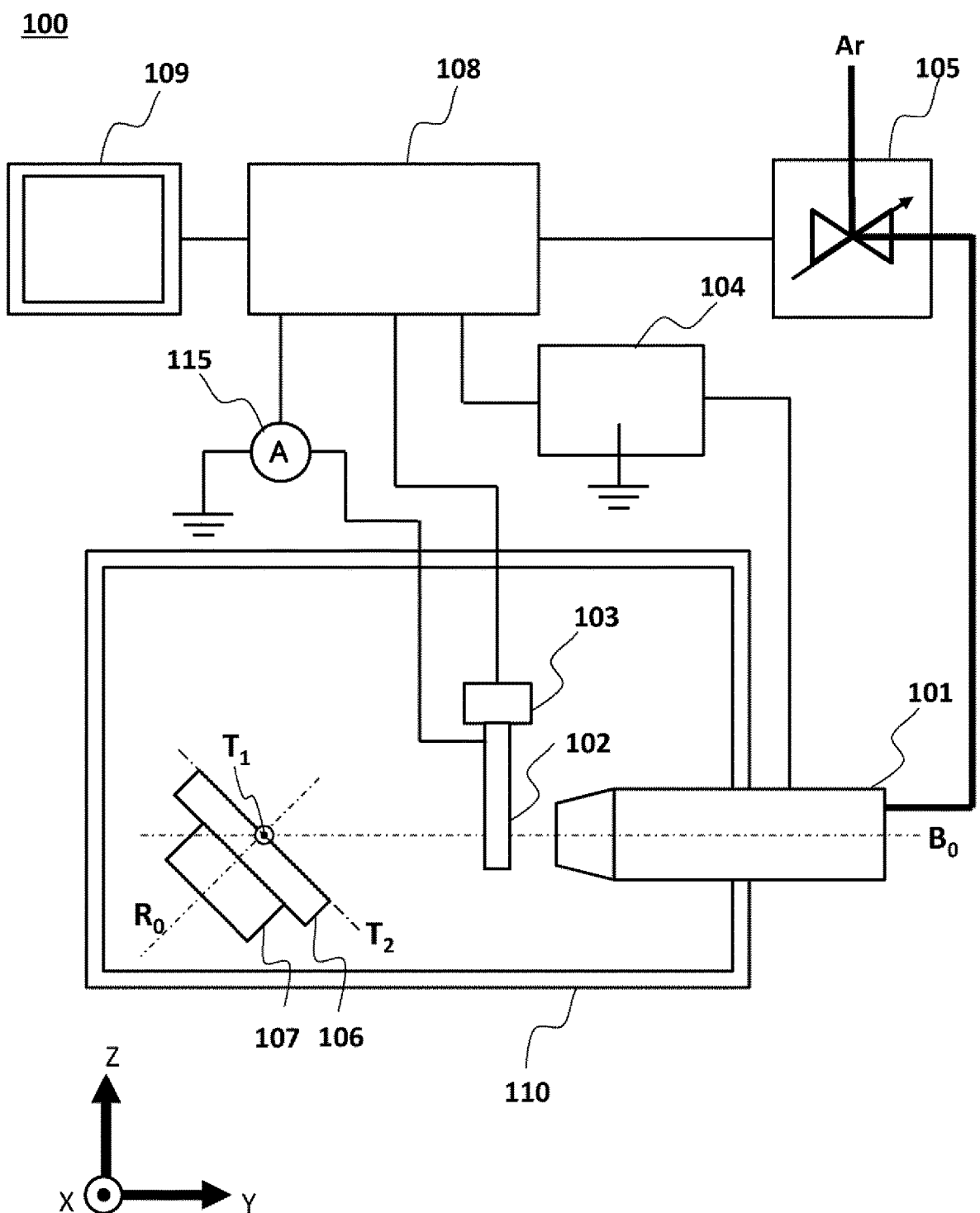

[FIG. 2]
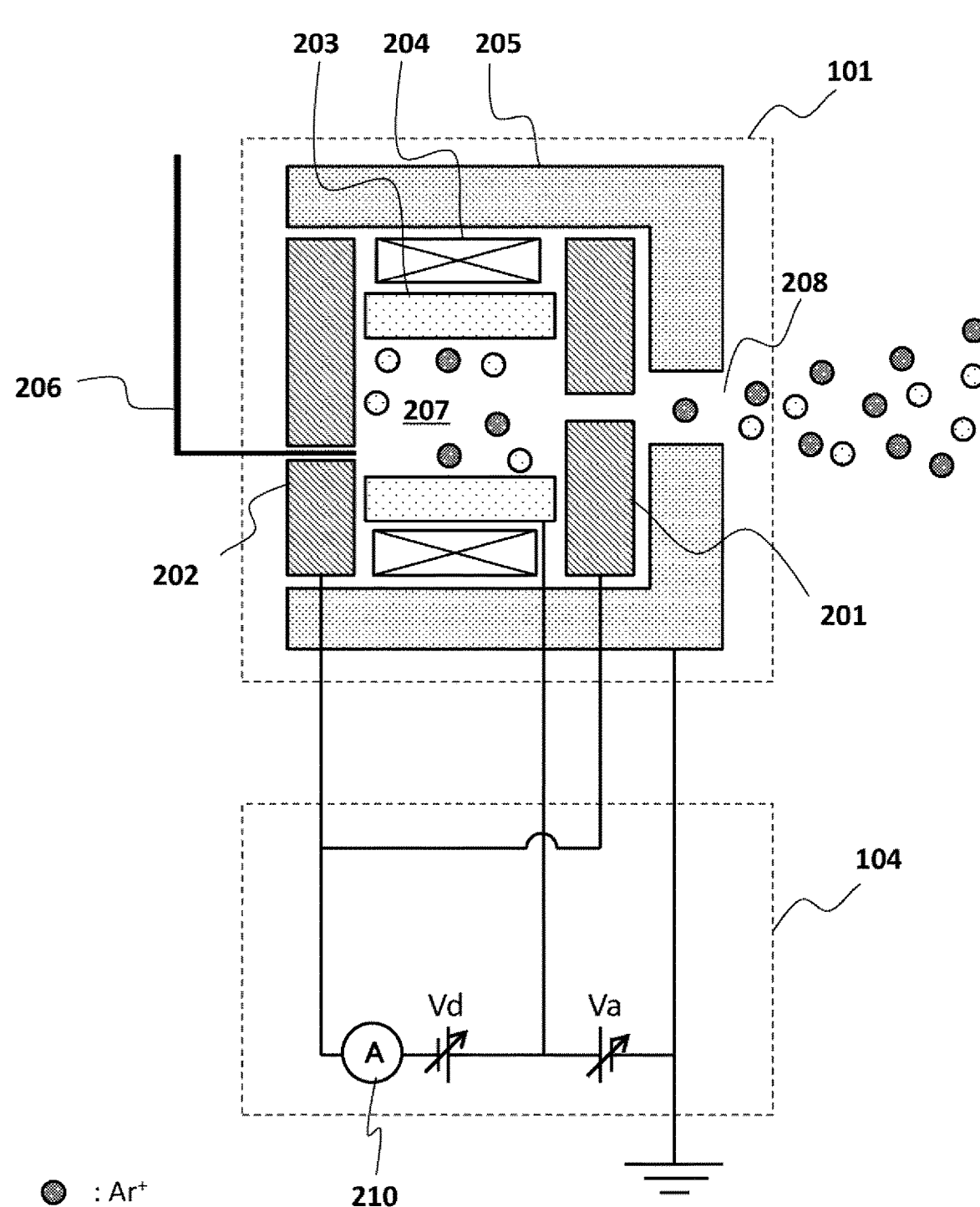
●  : Ar⁺
○  : ADSORPTION GAS ION

[FIG. 3A]
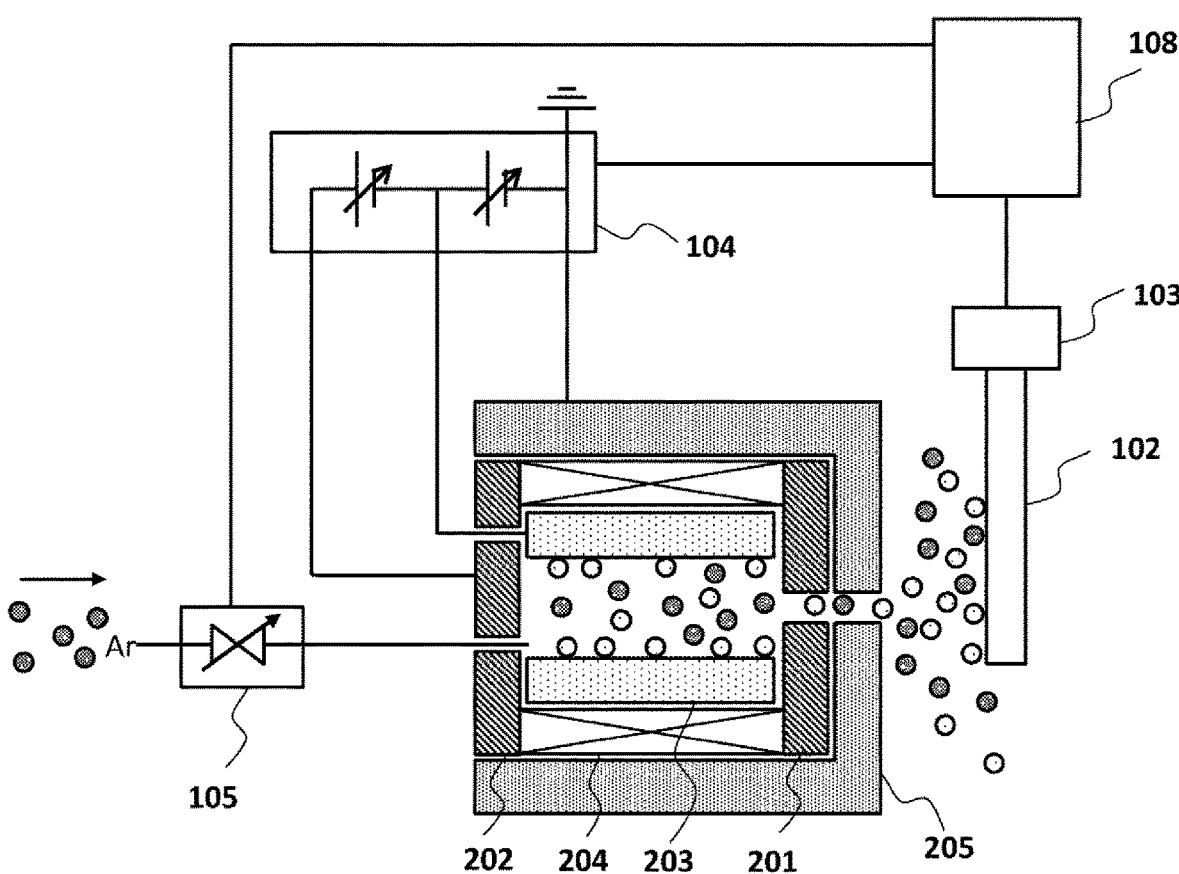

[FIG. 3B]
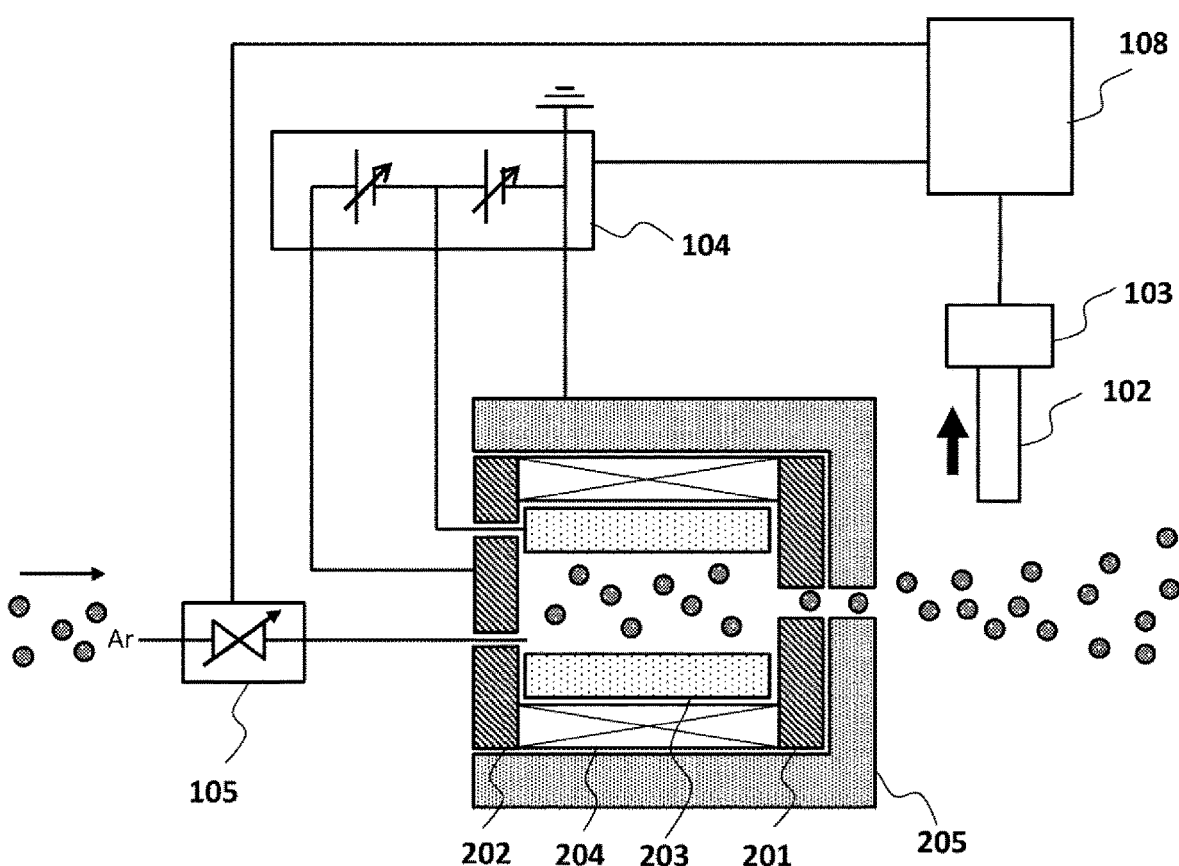

[FIG. 4]
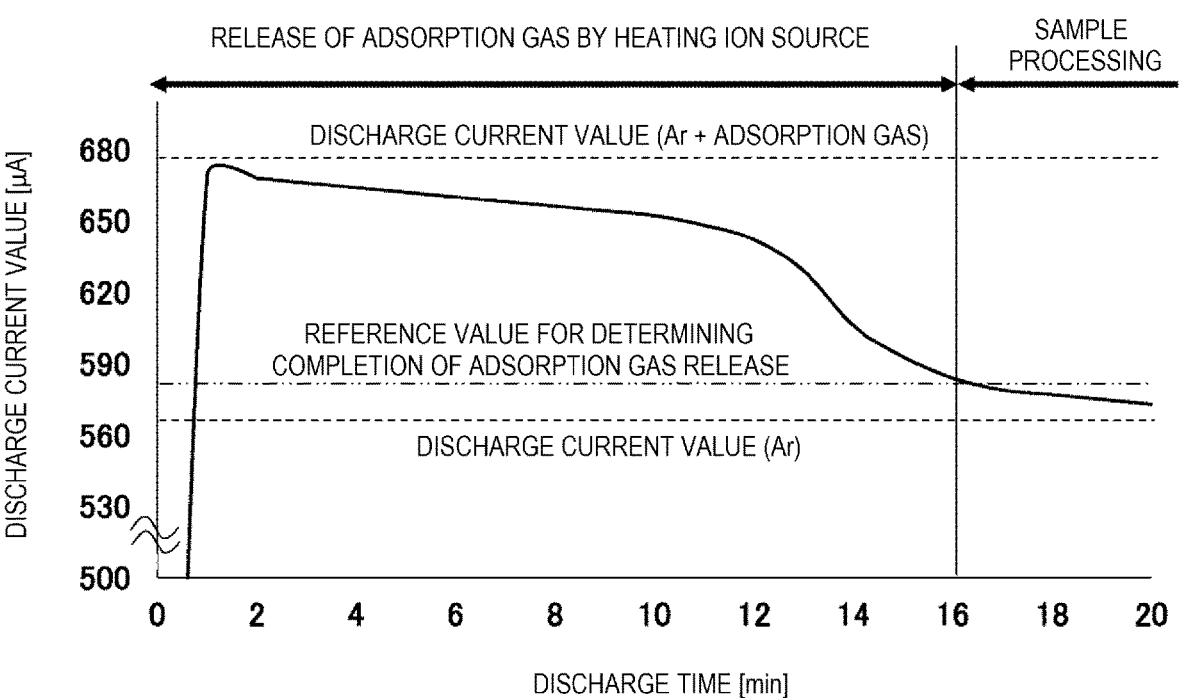

[FIG. 5]
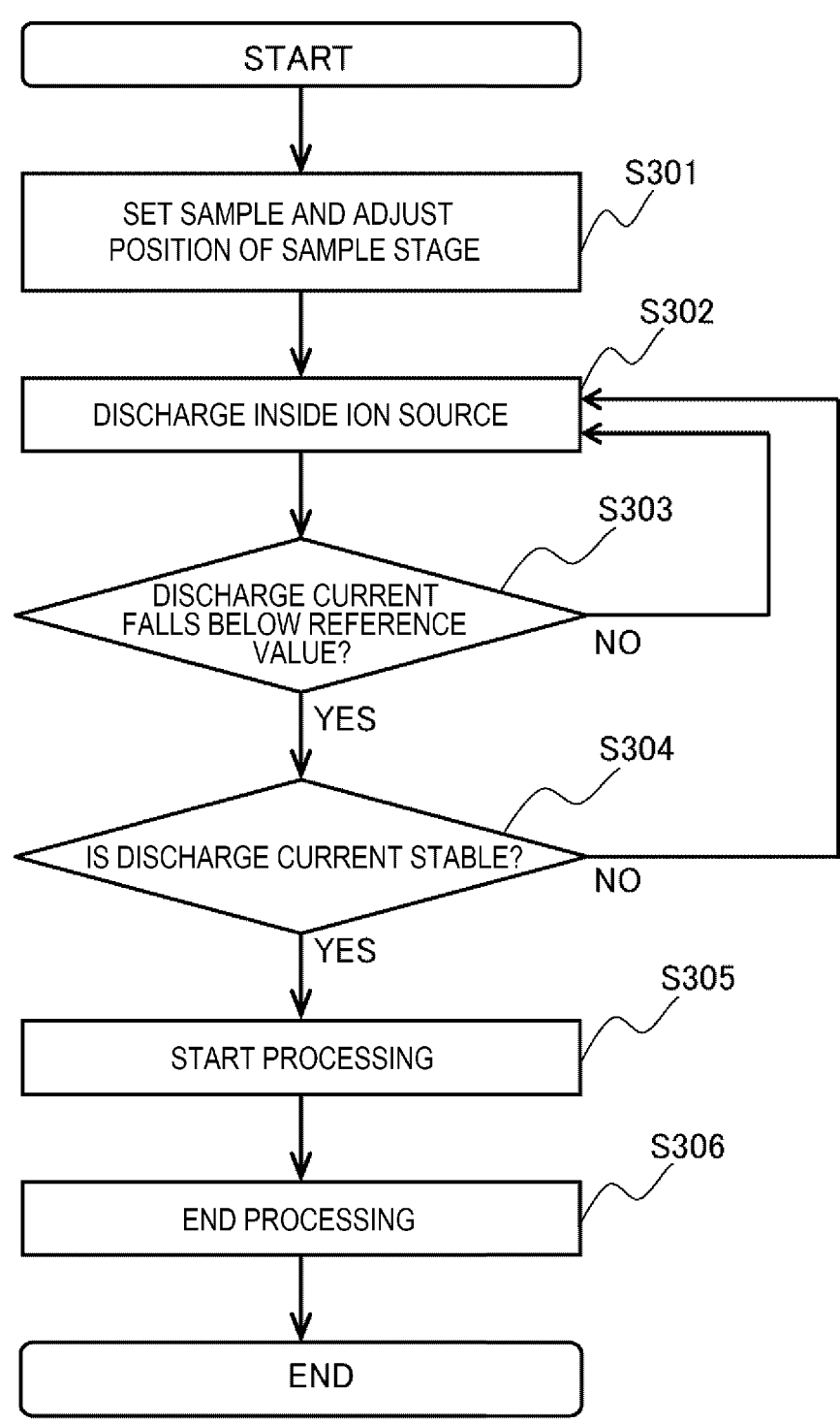

[FIG. 6]
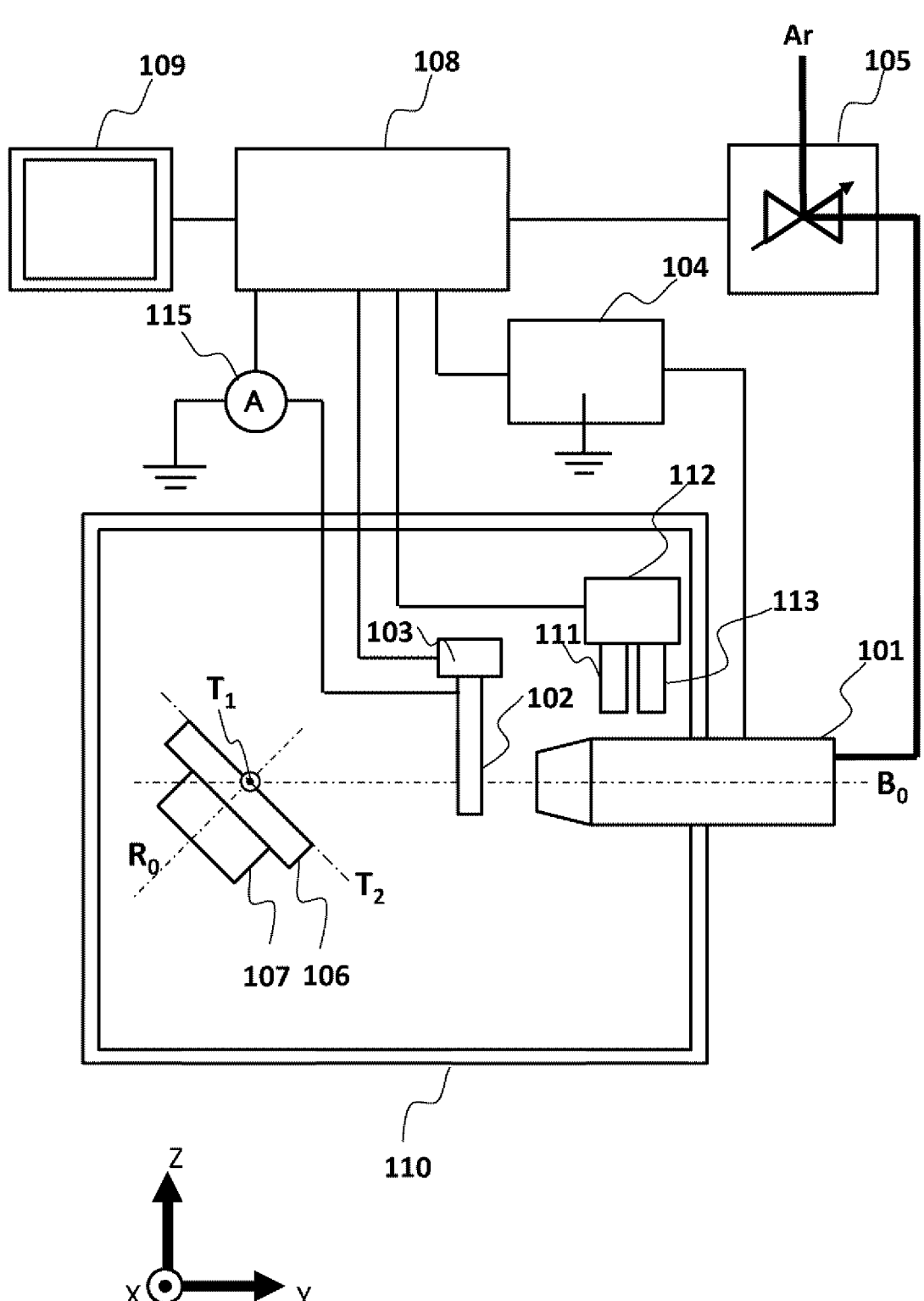

[FIG. 7]
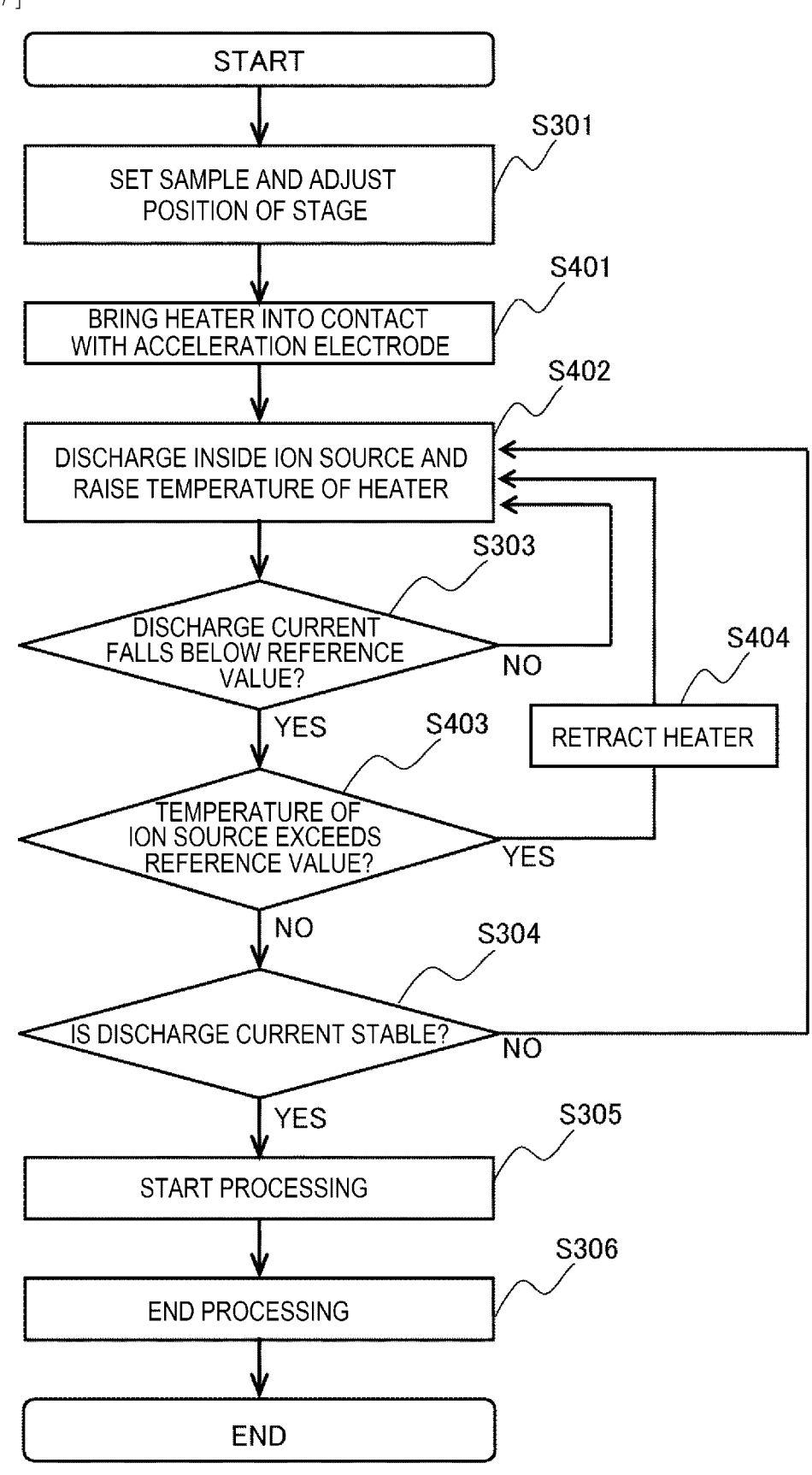

ION MILLING APPARATUS

TECHNICAL FIELD

The present invention relates to an ion milling apparatus.

BACKGROUND ART

An ion milling apparatus is an apparatus that can irradiate a sample (for example, a metal, a semiconductor, a glass, or a ceramic), which is an object to be observed with an electron microscope, with a non-focused ion beam, flip atoms on a surface of the sample by a sputtering phenomenon, polish the surface of the sample without a stress, and expose an internal structure of the sample. The surface of the sample or the exposed internal structure of the sample becomes an observation surface with a scanning electron microscope or a transmission electron microscope by irradiation with the ion beam.

When the surface polishing or processing of exposing the internal structure of the sample to be observed with the electron microscope is performed by the ion milling apparatus, a processing shape of the sample may be required to be uniformly maintained, for example, in a case of aiming at management of a mass production process. In the ion milling apparatus for processing the sample with the non-focused ion beam, it is necessary to maintain a constant ion beam current or ion distribution in order to improve uniformity of the processing shape.

It is known that, in a Penning type ion gun used in such an ion milling apparatus, since ions generated in an ionization chamber are also emitted to a cathode or an acceleration electrode inside the ion gun, a surface thereof is sputtered, and a phenomenon that the ions adhere to a component of the ion gun such as an anode occurs. Such deposits cause problems such as abnormal discharge or a short circuit. PTL 1 discloses that by providing irregularities on a surface of a cathode facing an ionization chamber, a sputtering yield of the cathode is reduced, and a generation amount of sputtered particles is reduced. PTL 2 discloses that a device for injecting a gas toward an ion gun is provided to move adhered substances adhering inside the ion gun.

CITATION LIST

Patent Literature

PTL 1: JP2014-235948A
PTL 2: WO2016/189614

SUMMARY OF INVENTION

Technical Problem

In order to improve the uniformity of the processing shape by the ion milling apparatus, it is necessary to set control parameters, such as an amount of an argon gas introduced into an ion source and a discharge voltage applied to the ion source, so as to maintain energy and distribution of an ion beam during a milling treatment in a certain range. However, it has been found that an influence of disturbances that cannot be controlled by the control parameters is large.

One of the disturbances is an influence of an adsorption gas derived from the atmosphere on a discharge current value and an ion beam current value. An ion source using a Penning method incorporates electrode components for generating electrons as described later. A cathode, which is one of such electrode components, is sputtered by argon ions generated during discharge, and a deposited film derived from the cathode is formed inside the ion source. The deposited film continues growing and finally peels off in a needle shape. A deposited film formed on an inner wall surface of an anode, which is one of the electrode components, may cause a short circuit between the anode and the cathode. When the short circuit occurs between the anode and the cathode, the discharge voltage cannot be applied. Therefore, the inner wall surface of the anode is intentionally roughened such that a contact area between the inner wall surface of the anode and the deposited film is increased and the deposited film is difficult to peel off. Specifically, grinding by sandblasting is performed such that surface roughness (Ra) of the inner wall surface of the anode at this time is larger than surface roughness of an inner wall surface of the cathode.

It has been found that during ventilation (open to the atmosphere) for replacing a sample, a gas derived from the atmosphere is adsorbed on the deposited film on the inner wall surface of the anode and the deposited film on the inner wall surface of the cathode, and the adsorbed gas influences the energy and the distribution of the ion beam. In particular, since the inner wall surface of the anode is roughened and irregularities are increased, an amount of the adsorbed gas is also large, which has a non-negligible influence.

Ideally, the discharge current value depends on the amount of the argon gas introduced, but in practice, when the ion beam starts to be emitted, an ionization amount of the gas derived from the atmosphere is added to the discharge current value, and on the other hand, the added discharge current of the gas derived from the atmosphere is decreased with the emission of the ion beam over time. Accordingly, it is difficult to obtain the uniformity of the processing shape by the ion milling apparatus.

Solution to Problem

An ion milling apparatus that is an embodiment of the invention includes: a sample chamber; a sample stage which is disposed in the sample chamber and on which a sample is to be placed; an ion source configured to emit, as a non-focused ion beam toward the sample, an ion generated by an electron generated by discharge between an anode and a cathode by accelerating the ion by an acceleration electrode; a conductive shutter disposed between the ion source and the sample stage and configured to shield the ion beam; a shutter drive source configured to drive the shutter; and a control unit configured to, in a state in which the ion beam is shielded by the shutter, apply a discharge voltage between the anode and the cathode and an acceleration voltage between the anode and the acceleration electrode, and to retract the shutter by the shutter drive source to a position where the ion beam is not shielded after any one of a discharge current flowing between the anode and the cathode due to the discharge and an ion beam current flowing caused by irradiation on the shutter with the ion beam falls below a predetermined reference value.

Advantageous Effects of Invention

In an ion milling apparatus, by releasing a gas adsorbed to an ion source before sample processing, processing reproducibility by the ion milling apparatus can be improved. Other problems and novel features will become apparent from the description of the present description and the accompanying drawings.

US 12,658,399 B2

BRIEF DESCRIPTION OF DRAWINGS

FIG. 1 is a configuration example (schematic diagram) of an ion milling apparatus according to Embodiment 1.

FIG. 2 is a schematic diagram illustrating an ion source and a power supply circuit for applying a control voltage to the ion source.

FIG. 3A is a diagram illustrating a process of releasing an adsorption gas from the ion source.

FIG. 3B is a diagram illustrating a process of releasing the adsorption gas from the ion source.

FIG. 4 is a graph illustrating a change in discharge current value over time.

FIG. 5 is a flowchart of sample processing according to Embodiment 1.

FIG. 6 is a configuration example (schematic diagram) of an ion milling apparatus according to Embodiment 2.

FIG. 7 is a flowchart of the sample processing according to Embodiment 1.

DESCRIPTION OF EMBODIMENTS

Hereinafter, embodiments of the invention will be described with reference to the drawings.

Embodiment 1

FIG. 1 is a schematic side diagram showing main parts of an ion milling apparatus 100 according to Embodiment 1. In FIG. 1, a vertical direction is indicated as a Z direction. The ion milling apparatus 100 includes, as main components, an ion source 101, a shutter 102, a shutter drive source 103, a power supply unit 104, a supply gas control unit 105, a sample stage 106, a sample stage drive source 107, a control unit 108, a display unit 109, a sample chamber 110, and an ammeter 115.

The ion milling apparatus 100 is used as a pretreatment apparatus for observing a surface or a cross section of a sample with a scanning electron microscope or a transmission electron microscope. An ion source for such a pretreatment apparatus often adopts a Penning method, which is effective for downsizing a structure. In the present embodiment, the ion source 101 also adopts the Penning method, and a non-focused ion beam is emitted from the ion source 101 toward a sample fixed to the sample stage 106. The control unit 108 controls an output of the ion beam by controlling a voltage applied from the power supply unit 104 to an electrode inside the ion source 101 and a gas flow rate supplied from the supply gas control unit 105. The conductive shutter 102 is provided between the ion source 101 and the sample stage 106. The shutter 102 shields the ion beam from the ion source 101 from being emitted to the sample, and also serves as a probe for measuring an ion beam current flowing caused by irradiation on the shutter 102 with the ion beam. The ion beam current emitted to the shutter 102 is measured by the ammeter 115, and an ion beam current value is output from the ammeter 115 to the control unit 108. The control unit 108 uses the ion beam current value to monitor an output state of the ion beam. The ion beam current value may be displayed on the display unit 109.

As described above, a gas in the atmosphere is adsorbed to electrode components of the ion source 101 during ventilation of the sample chamber 110, and an adsorption gas inside the ion source 101 is ionized and released, whereby the ion beam emitted from the ion source 101 exceeds a set ion beam current value. Therefore, first, the ion beam is shielded by the shutter 102 and the ion beam current value is measured. When the measured ion beam current value falls below the set value, it is regarded that the adsorption gas inside the ion source 101 is sufficiently released, the shutter drive source 103 is driven by the control unit 108 to retract the shutter 102, and an ion beam derived from argon supplied from the supply gas control unit 105 is emitted to the sample placed on the sample stage 106.

The sample stage 106 on which the sample is placed is attached to the sample chamber 110 via the sample stage drive source 107. The sample stage drive source 107 rotates the sample stage 106 about a rotation axis Ro. In addition, the sample stage drive source 107 is attached to the sample chamber 110 such that a position of the sample stage 106 can be adjusted in each of an X direction, a Y direction, and a Z direction, and an orientation of the sample stage 106 with respect to an ion beam central axis $B_0$ can be adjusted in an angular direction relative to an XZ plane (rotation direction about a $T_1$ axis) and an angular direction relative to a YZ plane (rotation direction about a $T_2$ axis).

FIG. 2 is a schematic diagram illustrating the ion source 101 adopting the Penning method and a power supply circuit for applying a control voltage to the electrode components of the ion source 101. The power supply circuit is a part of the power supply unit 104.

The ion source 101 includes a first cathode 201, a second cathode 202, an anode 203, a permanent magnet 204, an acceleration electrode 205, a gas pipe 206, an ionization chamber 207, and an ion beam irradiation port 208. As described above, in order to prevent a short circuit due to a deposited film between the anode and the cathode, surface roughness (Ra) of an inner wall surface of the anode facing the ionization chamber 207 is made larger than surface roughness of an inner wall surface of the cathode facing the ionization chamber 207. In order to generate an ion beam, an argon gas is injected into the ionization chamber 207 through the gas pipe 206. The first cathode 201 and the second cathode 202 having the same potential are disposed facing each other in the ion source 101, and the anode 203 is disposed between the first cathode 201 and the second cathode 202. Electrons are generated by applying a discharge voltage Vd between the cathodes 201 and 202 and the anode 203 from the power supply unit 104. The electrons are retained by the permanent magnet 204 disposed in the ion source 101, and collide with the argon gas injected through the gas pipe 206 in the ionization chamber 207 to generate argon ions. An acceleration voltage Va is applied between the anode 203 and the acceleration electrode 205 from the power supply unit 104, and the generated argon ions are attracted to the acceleration electrode 205 and emitted as an ion beam through the ion beam irradiation port 208. An ammeter 210 is provided between the anode 203 and the first cathode 201 and the second cathode 202 in the power supply circuit, and a discharge current flowing between the cathode and the anode due to discharge is measured by the ammeter 210. A discharge current value measured by the ammeter 210 is also output to the control unit 108. The control unit 108 uses the discharge current value to monitor an output state of the ion beam. The discharge current value may be displayed on the display unit 109.

The output of the ion beam emitted from the ion source 101 depends on a discharge situation inside the ion source 101. In the ion source 101 adopting the Penning method, as the irradiation with the ion beam is repeated, fine particles and the like generated from a sample to be irradiated adhere as stains to the first cathode 201, the second cathode 202, and the anode 203. During the ventilation of the sample chamber 110, the gas in the atmosphere is adsorbed by the stains on these electrode components and ionized together with the argon gas supplied through the gas pipe 206, whereby the discharge current value and the ion beam current value at start of processing are higher than expected. In order to perform sample processing with high reproducibility, it is necessary to maintain the discharge current value and the ion beam current value constant, so that it is necessary to release the adsorption gas before milling the sample.

FIGS. 3A and 3B illustrate a process of releasing the adsorption gas from the ion source 101. During the ventilation of the sample chamber 110, the gas in the atmosphere is adsorbed to the first cathode 201, the second cathode 202, and the anode 203 of the ion source 101. As illustrated in FIG. 3A, first, the shutter 102 is moved by the shutter drive source 103 to a position where the ion beam from the ion source 101 is shielded. In this state, the control unit 108 causes the power supply unit 104 to apply a predetermined voltage to the first cathode 201, the second cathode 202, the anode 203, and the acceleration electrode 205. When the voltage is applied to the electrode components inside the ion source 101, a temperature inside the ion source 101 rises, and the release of the adsorption gas is promoted. In addition, the adsorption gas collides with the electrons generated in the ion source 101 by the voltage application, is ionized, is extracted by the acceleration electrode 205, and is emitted as an ion beam to the shutter 102. The ion beam current value emitted to the shutter 102 is constantly monitored by the control unit 108, and when the ion beam current value falls below a certain value, it is regarded that the adsorption gas is released. Thereafter, as illustrated in FIG. 3B, the shutter 102 retracts from a front of the ion source 101 by the shutter drive source 103, and the sample is irradiated with the ion beam.

FIG. 4 is a graph illustrating a change in discharge current value over time according to the present embodiment. The discharge current value immediately after the start of the discharge indicates a high value because adsorption gas ions are contained in addition to the argon ions. Since the adsorption gas is gradually released as the temperature inside the ion source 101 rises, the discharge current value inside the ion source 101 gradually decreases, and finally becomes a value (steady-state value) of only the argon ions. In the present embodiment, a period during which the adsorption gas inside the ion source 101 is released before the sample processing is provided. At an end of the adsorption gas release period, the discharge current value or the ion beam current value is monitored, and after the discharge current value or the ion beam current value falls below a reference value for determining completion of the adsorption gas release, the process shifts to the sample processing. Accordingly, the sample can be irradiated with a stable ion beam having a little change in discharge current value and ion beam current value inside the ion source 101, and as a result, uniformity of a processing shape by the ion beam is improved.

FIG. 5 is a flowchart of the sample processing in the ion milling apparatus 100 according to Embodiment 1. The flowchart is executed by the control unit 108 after setting a sample (S301).

S301: The sample is set on the sample stage 106, and the position of the sample stage is adjusted by the sample stage drive source 107. After the sample is set, the inside of the sample chamber 110 is exhausted and depressurized by a vacuum exhaust system (not illustrated).

S302: The control unit 108 applies the discharge voltage Vd between the anode 203 and the first cathode 201 and the second cathode 202 having the same potential to raise the temperature inside the ion source 101 and release the adsorption gas from the electrode components. In addition, the acceleration voltage Va is applied between the anode 203 and the acceleration electrode 205, and the ionized adsorption gas is emitted as an ion beam to the shutter 102 in front of the ion source.

S303: The control unit 108 compares the ion beam current value of the ion beam emitted to the shutter 102 or the discharge current value measured by the ammeter 210 with a preset reference value of the ion beam current value or the discharge current value. When the ion beam current value or the discharge current value does not fall below the reference value, the discharge inside the ion source 101 is continued to promote the release of the adsorption gas.

S304: When the ion beam current value or the discharge current value falls below the reference value, the control unit 108 determines whether the ion beam current value or the discharge current value is stable. As a determination method, a reference range of the ion beam current value or the discharge current value is provided, and it is confirmed that a fluctuation range of the ion beam current value or the discharge current value is less than or equal to the reference range for a predetermined period. When the ion beam current value or the discharge current value is not stable, the discharge inside the ion source 101 is continued to promote the release of the adsorption gas.

S305: When it is determined that the ion beam current value or the discharge current value falls below the reference value and is stable, the control unit 108 causes the shutter drive source 103 to retract the shutter 102 to a position where the ion beam is not shielded, and causes the sample to be irradiated with the ion beam to start the processing.

S306: The control unit 108 causes the shutter drive source 103 to move the shutter 102 to the front of the ion source 101 to end the sample processing.

A timing of starting supply of the argon gas is not limited. The supply of the argon gas may be started before or at the same time as the start of the voltage application to the ion source, or the supply of the argon gas may be started after determining completion of the adsorption gas release without supplying the argon gas after the start of the voltage application to the ion source or during the adsorption gas release. By delaying the start of the supply of the argon gas, heating of the ion source 101 can be promoted and the period required for the adsorption gas release can be shortened. Since the reference value in step S303 varies depending on presence or absence of the argon gas, it is necessary to determine the reference value according to the timing of the supply of the argon gas.

Embodiment 2

FIG. 6 is a schematic side diagram showing main parts of an ion milling apparatus 200 according to Embodiment 2. The ion milling apparatus 200 includes a heating mechanism that heats the ion source 101. The same components as those of Embodiment 1 are denoted by the same reference numerals, and redundant description thereof is omitted. The heating mechanism disposed near the ion source 101 includes a heater 111, a heater drive source 112, and a thermocouple 113. In Embodiment 2, when the heater 111 heats the ion source to a value set in a range of 40° ° C. to 130° C., a time until completion of adsorption gas release is shortened. The reason why an upper limit of a heating temperature by the heater is set in the range of 40° C. to 130° C. is that a magnetic field inside the ion source 101 is not influenced. In this range, the heating temperature of the heater 111 may be adjusted according to an amount of the adsorption gas of the ion source.

The heater 111 can be moved by the heater drive source 112, and heats the ion source 101 by contact with the acceleration electrode 205 in the ion source 101. In addition, the heater drive source 112 also brings the thermocouple 113 into contact with the acceleration electrode 205 together with the heater 111, and a temperature of the ion source 101 is monitored. When a temperature of the acceleration electrode 205 exceeds a set upper limit value, the control unit 108 controls the heater drive source 112 to retract the heater 111.

FIG. 7 is a flowchart of sample processing in the ion milling apparatus 200 according to Embodiment 2. The flowchart is also executed by the control unit 108 after setting a sample (S301).

Since the flowchart is basically the same as the flowchart (FIG. 5) in Embodiment 1, steps added to the flowchart in Embodiment 1 will be mainly described. After the sample is set and the position of the sample stage is adjusted (S301), the control unit 108 causes the heater drive source 112 to bring the heater 111 and the thermocouple 113 into contact with the acceleration electrode 205 (S401). Thereafter, the control unit 108 causes discharge inside the ion source and raises a temperature of the heater (S402). During heating by the heater, the temperature of the ion source 101 is monitored by the thermocouple 113, and when the temperature of the ion source 101 exceeds a predetermined value, the control unit 108 operates the heater drive source 112 to retract the heater 111 from the ion source 101 and stop heating of the ion source 101.

In Embodiment 2, similar to Embodiment 1, a timing of starting supply of an argon gas is also not limited.

Although the invention made by the present inventor has been specifically described above based on the embodiments, the invention is not limited to the described embodiments, and various modifications can be made without departing from the gist thereof. For example, in a state in which a reference for starting the processing by the ion beam is satisfied, the control unit 108 may automatically control the shutter drive source 103 to retract the shutter 102, or may notify, on the display unit 109, a user that the reference for starting the processing by the ion beam is satisfied and allow the user to instruct the shutter drive source 103 to retract the shutter 102. In addition, a discharge voltage applied to the ion source before the sample processing for the adsorption gas release may be higher than a discharge voltage during the sample processing according to the amount of the adsorption gas.

REFERENCE SIGNS LIST

100, 200: ion milling apparatus
101: ion source
102: shutter
103: shutter drive source
104: power supply unit
105: supply gas control unit
106: sample stage
107: sample stage drive source
108: control unit
109: display unit
110: sample chamber
111: heater
112: heater drive source
113: thermocouple

8

115: ammeter
201: first cathode
202: second cathode
203: anode
204: permanent magnet
205: acceleration electrode
206: gas pipe
207: ionization chamber
208: ion beam irradiation port
210: ammeter

The invention claimed is:

1. An ion milling apparatus comprising:
a sample chamber;
a sample stage which is disposed in the sample chamber and on which a sample is to be placed;
an ion source configured to emit, as a non-focused ion beam toward the sample, an ion generated by an electron generated by discharge between an anode and a cathode by accelerating the ion by an acceleration electrode;
a conductive shutter disposed between the ion source and the sample stage and configured to shield the ion beam;
a shutter drive source configured to drive the shutter; and
a control unit configured to, in a state in which the ion beam is shielded by the shutter, apply a discharge voltage between the anode and the cathode and an acceleration voltage between the anode and the acceleration electrode, and to retract the shutter by the shutter drive source to a position where the ion beam is not shielded after any one of a discharge current flowing between the anode and the cathode due to the discharge and an ion beam current flowing caused by irradiation on the shutter with the ion beam decreases to fall below a predetermined reference value.

2. The ion milling apparatus according to claim 1, wherein the discharge current flowing between the anode and the cathode due to the discharge or the ion beam current flowing caused by the irradiation on the shutter with the ion beam decreases, due to release of adsorption gas inside the ion source as temperature inside the ion source rises.

3. The ion milling apparatus according to claim 1, wherein the control unit is configured to retract the shutter by the shutter drive source to the position where the ion beam is not shielded after any one of the discharge current flowing between the anode and the cathode due to the discharge and the ion beam current flowing caused by the irradiation on the shutter with the ion beam decreases to fall below the predetermined reference value and has a fluctuation range less than or equal to a predetermined reference range for a predetermined period.

4. The ion milling apparatus according to claim 1, further comprising:
a display unit configured to display a value of the discharge current or the ion beam current.

5. The ion milling apparatus according to claim 4, wherein the display unit displays that any one of the discharge current and the ion beam current decreases to fall below the predetermined reference value.

6. The ion milling apparatus according to claim 1, further comprising:
a heater;
a thermocouple; and
a heater drive source configured to drive the heater and the thermocouple, wherein the control unit is configured to bring the heater and the thermocouple into contact with the acceleration electrode by the heater drive source and to heat the ion source by the heater.

7. The ion milling apparatus according to claim 6, wherein the control unit is configured to monitor a temperature of the ion source caused by the thermocouple, and when the temperature of the ion source exceeds a predetermined temperature, to cause the heater to retract from the ion source by the heater drive source to stop heating the ion source by the heater.

8. The ion milling apparatus according to claim 1, further comprising:

a supply gas control unit configured to supply an argon gas to the ion source, wherein the control unit is configured to start supply of the argon gas from the supply gas control unit to the ion source after applying the discharge voltage between the anode and the cathode and the acceleration voltage between the anode and the acceleration electrode.

9. The ion milling apparatus according to claim 1, wherein an inner wall surface of the anode is roughened more than an inner wall surface of the cathode.

* * * * *